(12) United States Patent
Krivokapic

(10) Patent No.: US 7,670,914 B2
(45) Date of Patent: Mar. 2, 2010

(54) METHODS FOR FABRICATING MULTIPLE FINGER TRANSISTORS

(75) Inventor: Zoran Krivokapic, Santa Clara, CA (US)

(73) Assignee: GlobalFoundries Inc., Grand Caymen (KY)

(*) Notice: Subject to any disclaimer, the term of this patent is extended or adjusted under 35 U.S.C. 154(b) by 417 days.

(21) Appl. No.: 11/536,114

(22) Filed: Sep. 28, 2006

(65) Prior Publication Data

US 2008/0090360 A1    Apr. 17, 2008

(51) Int. Cl.
*H01L 21/336* (2006.01)
(52) U.S. Cl. .................... 438/300; 257/E21.431
(58) Field of Classification Search .......... 257/365, 257/408, E21.431; 438/157, 283, 286, 300
See application file for complete search history.

(56) References Cited

U.S. PATENT DOCUMENTS

| | | | | |
|---|---|---|---|---|
| 5,615,073 A | * | 3/1997 | Fried et al. | 361/56 |
| 5,677,224 A | * | 10/1997 | Kadosh et al. | 438/197 |
| 5,705,414 A | * | 1/1998 | Lustig | 438/585 |
| 6,297,105 B1 | * | 10/2001 | Guo | 438/286 |
| 6,335,248 B1 | * | 1/2002 | Mandelman et al. | 438/279 |
| 6,362,057 B1 | * | 3/2002 | Taylor et al. | 438/286 |
| 2001/0010390 A1 | * | 8/2001 | Nomachi et al. | 257/589 |
| 2005/0093033 A1 | * | 5/2005 | Kinoshita et al. | 257/288 |
| 2006/0194395 A1 | * | 8/2006 | Ning et al. | 438/286 |
| 2007/0132020 A1 | * | 6/2007 | de Fresart et al. | 257/339 |

* cited by examiner

*Primary Examiner*—W. David Coleman
*Assistant Examiner*—Daniel Shook
(74) *Attorney, Agent, or Firm*—Ingrassia, Fisher & Lorenz, P.C.

(57) ABSTRACT

Methods are provided for the fabrication of multiple finger transistors. A method comprises forming a layer of gate-forming material overlying a semiconductor substrate and forming a layer of dummy gate material overlying the layer of gate-forming material. The layer of dummy gate material is etched to form a dummy gate and sidewall spacers are formed about sidewalls of the dummy gate. The dummy gate is removed and the layer of gate-forming material is etched using the sidewall spacers as a mask to form at least two gate electrodes.

13 Claims, 6 Drawing Sheets

METHODS FOR FABRICATING MULTIPLE FINGER TRANSISTORS

FIELD OF THE INVENTION

The present invention generally relates to semiconductor devices, and more particularly relates to methods for fabricating multiple finger transistors.

BACKGROUND OF THE INVENTION

Multiple finger metal-oxide-semiconductor field effect transistor (MOSFET) structures are conventionally used in high frequency applications because the reduced resistances of multiple finger MOSFETs give rise to improved high frequency performance compared to single gate MOSFET transistors. In addition, for the short channel lengths and large gate widths of modern MOSFETs, a single gate would be extensive in one dimension, posing a layout problem. This problem is alleviated in a multi-finger layout because the gate width is distributed among the fingers.

However, the trend in integrated circuit (IC) design involves the increase in device performance and functionality with a decrease in device size and fabrication complexity. Multiple finger MOS devices having gate lengths below 5 nm is an emerging technology. However, the fabrication of such devices is typically complex, requiring multiple masking and etching steps, even for devices having symmetric active regions. For multiple finger MOS devices having asymmetric active areas, the fabrication techniques are even more complex.

Accordingly, it is desirable to provide a method for fabricating multiple finger MOS transistors that reduces the number of masking and etching steps used. In addition, it is desirable to provide a method for fabricating multiple finger MOS transistors that uses spacer lithography to achieve small device dimensions. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the invention, a method is provided for fabricating a multiple finger transistor. The method comprises forming a layer of gate-forming material overlying a semiconductor substrate and forming a layer of dummy gate material overlying the layer of gate-forming material. The layer of dummy gate material is etched to form a dummy gate and sidewall spacers are formed about sidewalls of the dummy gate. The dummy gate is removed and the layer of gate-forming material is etched using the sidewall spacers as a mask to form at least two gate electrodes.

In accordance with another exemplary embodiment of the invention, a method is provided for fabricating a multiple finger transistor. The method comprises forming at least two gate electrodes overlying a surface of a semiconductor substrate, wherein the at least two gate electrodes are separated by a space. First impurity dopants are implanted into the semiconductor substrate using a first implant energy, wherein the at least two gate electrodes serve as an implantation mask. First sidewall spacers are formed about the at least two gate electrodes and within the space. The first sidewall spacers within the space contact each other. Second impurity dopants are implanted into the semiconductor substrate using a second implant energy, wherein the first sidewall spacers and the at least two gate electrodes serve as an implantation mask. A portion of the semiconductor substrate is removed from the surface of the semiconductor substrate to form a recess and semiconductor material is selectively epitaxially grown in the recess on the semiconductor substrate. Regions comprising metal are formed on the semiconductor material.

In accordance with a further exemplary embodiment of the invention, a method is provided for fabricating a multiple finger transistor. The method comprises forming at least two gate electrodes overlying a semiconductor substrate and forming first sidewall spacers about the at least two gate electrodes. First impurity dopants are implanted into the semiconductor substrate using a first implant energy, wherein the at least two gate electrodes and first sidewall spacers serve as an implantation mask. Second sidewall spacers are formed about the first sidewall spacers and second impurity dopants are implanted into the semiconductor substrate using a second implant energy. The at least two gate electrodes, the first sidewall spacers, and the second sidewall spacers serve as an implantation mask. Third sidewall spacers are formed, wherein the third sidewall spacers between the at least two gate electrodes contact each other. First metal regions are formed on the semiconductor substrate and a portion of the semiconductor substrate between the two gate electrodes is exposed. A second metal region is formed on the exposed semiconductor substrate.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
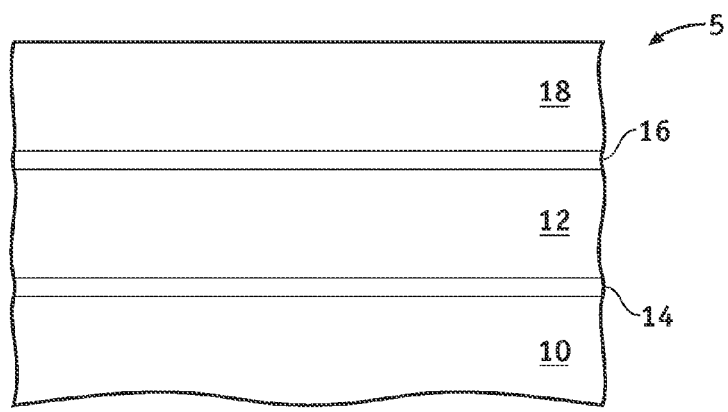
FIGS. 1-5 illustrate, in cross-section, a method for fabricating a multiple finger transistor, in accordance with an exemplary embodiment of the present invention.

In accordance with an exemplary embodiment of the present invention, a method for fabricating a multiple finger MOSFET transistor 5 is illustrated in FIGS. 1-5. Referring to FIG. 1, the method includes forming a gate insulator 14 overlying a semiconductor substrate 10. The semiconductor substrate is preferably a silicon substrate wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. Semiconductor substrate 10 will hereinafter be referred to for convenience, but without limitation, as a silicon substrate. Silicon substrate 10 may be a bulk silicon wafer, or may be a thin layer of silicon on an insulating layer (commonly know as silicon-on-insulator or SOI) that, in turn, is supported by a carrier wafer. The silicon substrate is impurity doped, for example by forming N-type well regions and/or P-type well regions for the fabrication of P-channel (PMOS) transistors and/or N-channel (NMOS) transistors.

The gate insulator 14 may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited, for example, in known manner by chemical vapor deposition (CVD), low pressure chemical vapor deposition (LPCVD), semi-atmospheric chemical vapor deposition (SACVD), or plasma enhanced chemical vapor deposition (PECVD). The gate insulator material is typically 0.5-5 nm in thickness.

A layer of gate electrode-forming material 12, preferably polycrystalline silicon, is deposited overlying the gate insulator 14. Other electrically conductive gate electrode-forming materials such as metals and metal silicides also may be deposited. The material may be formed by itself or with appropriate impurity doping that can set the necessary threshold voltage of the transistor. The gate electrode-forming material will hereinafter be referred to as polycrystalline silicon, although those of skill in the art will recognize that other materials can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. Although not illustrated, regions of electrically isolating material such as shallow trench isolation (STI) regions can be formed to extend into semiconductor substrate 10 to electrically isolate between multiple finger transistors of the MOS circuit as required by the circuit function being implemented.

A layer 16 of antireflective coating (ARC) material, such as, for example, silicon oxide, silicon nitride, or silicon oxynitride, can be deposited onto the surface of the polycrystalline silicon layer 12 to act as a hard mask and aid in the subsequent patterning of the polycrystalline silicon. A layer 18 of dummy gate material is then formed overlying the ARC layer 16. The dummy gate material layer 18 may be formed of any material that has a faster etch rate than that of the ARC layer 16 when exposed to the same etch chemistry. In addition, the dummy gate material is any material that can be etched to have substantially straight, vertical sidewalls. In a preferred embodiment of the present invention, the dummy gate material layer comprises amorphous silicon ($\alpha$-silicon). In an exemplary embodiment of the present invention, the dummy gate material layer has a thickness in the range of about 25 to about 125 nm, preferably about 50 to about 100 nm.

Figure 2:
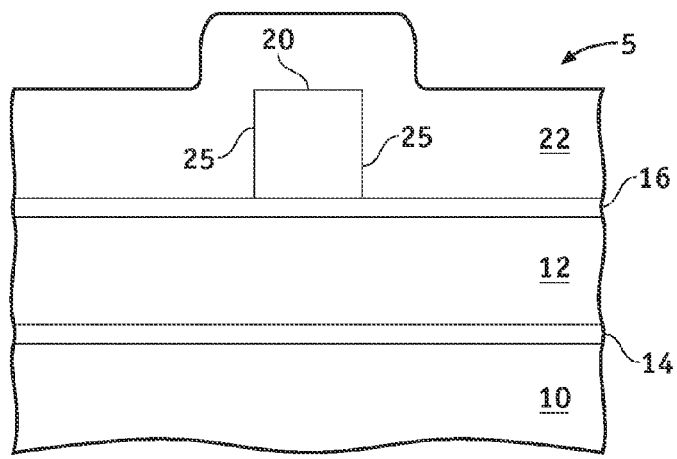
Figure 3:
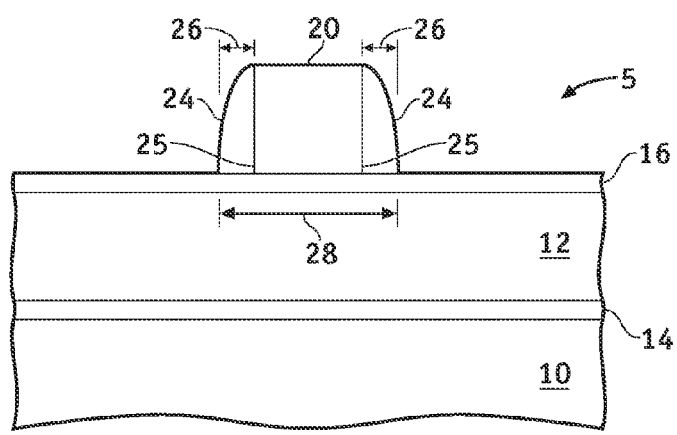

The method in accordance with an exemplary embodiment of the present invention continues with the patterning and etching of dummy gate material layer 18 to form a dummy gate 20 having substantially straight, vertical sidewalls 25, as illustrated in FIG. 2. Dummy gate material layer 18 can be patterned and etched by anisotropic etching, such as reactive ion etching (RIE), using ARC layer 16 as an etch stop layer. After formation of dummy gate 20, a layer 22 of spacer-forming material is deposited conformally overlying dummy gate 20 and ARC layer 16. Layer 22 can be, for example, a layer or layers of silicon nitride, silicon oxide, silicon oxynitride, or the like. Preferably, layer 22 comprises silicon nitride. Layer 22 is etched to form sidewall spacers 24 about sidewalls 25 of dummy gate 20, as illustrated in FIG. 3. In an exemplary embodiment of the invention, for 32 nm node technology, the width of each sidewall spacer 24, illustrated by double-headed arrows 26, is no more than 10 nm and the width of the two spacers and the dummy gate 20, illustrated by double-headed arrow 28, is in the range of about 50 to about 70 nm. It will be appreciated that these dimensions may vary for smaller or larger node technology. After forming the sidewall spacers, the dummy gate 20 is removed using a suitable dry etch or wet etch, using ARC layer 16 as an etch stop layer.

Figure 4:
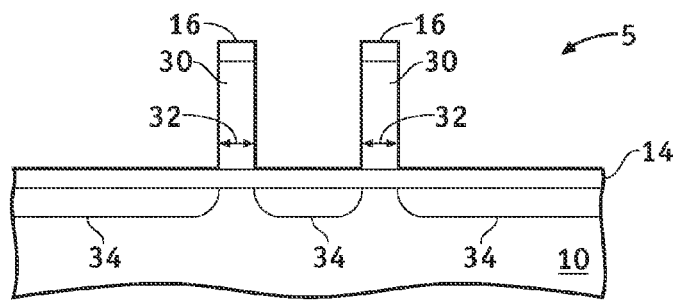

Referring to FIG. 4, ARC layer 16 is photolithographically patterned using sidewall spacers 24 as a mask and the underlying gate electrode-forming material 12 is etched to form at least two gate electrodes 30. If the gate electrode-forming material layer is formed of polycrystalline silicon, the polycrystalline silicon can be etched by, for example, reactive ion etching (RIE) using a Cl$^-$ or HBr/O$_2$ chemistry and the ARC layer can be etched, for example, by RIE in a CHF$_3$, CF$_4$, or SF$_6$ chemistry. Accordingly, because sidewall spacers 24 are used as an etch mask, the width of each of the gate electrodes 30, illustrated by double-headed arrows 32, is approximately the same as the width of the sidewall spacers 24. Thus, in accordance with an exemplary embodiment of the present invention, for 32 nm node technology, the width of each gate electrode 30 is no more than about 10 nm and the gates are separated by no more than about 50 nm. After formation of the gate electrodes, the sidewall spacers 24 can be removed by etching using an etchant that etches the sidewall spacer material in preference to the material of ARC layer 16 or the material of gate electrodes 30.

Figure 5:
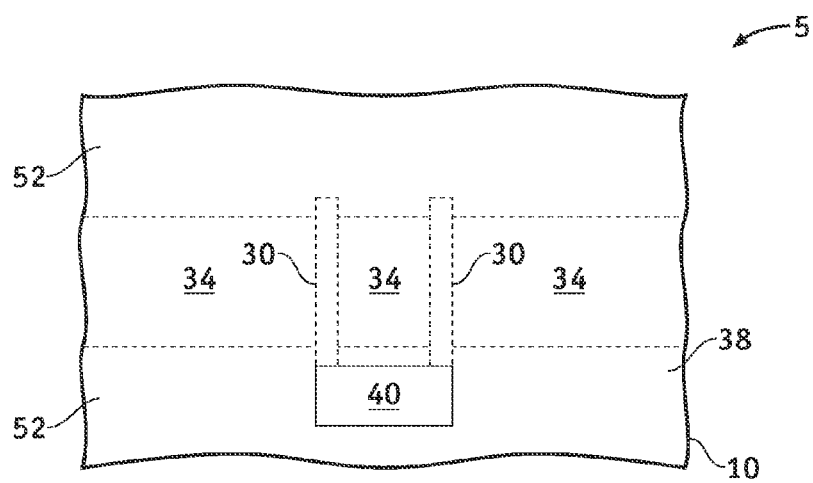

In accordance with an exemplary embodiment of the invention, source and drain regions 34 are formed in the semiconductor substrate 10 by introducing appropriate impurity dopants, such as arsenic or phosphorus for an NMOS transistor and boron for a PMOS transistor, and then subjecting the semiconductor substrate to an anneal process. The impurity dopants preferably are introduced by ion implantation. As illustrated in FIG. 5, which is a plan view of multiple finger transistor 5, a dielectric material 38 is deposited overlying source and drain regions 34 and gates 30, a contact opening (not shown) is formed within dielectric material 38, and a conductive gate contact 40 is formed within the contact opening to make conductive contact to gates 30. Conductive contacts (not shown) also are made through dielectric material 38 to source and drain regions 34. Regions 52 disposed outside of source and drain regions 34 are regions of electrical isolation that are formed, for example, by shallow trench isolation (STI). As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material the surface is usually planarized, for example by chemical mechanical planarization (CMP).

Figure 6:
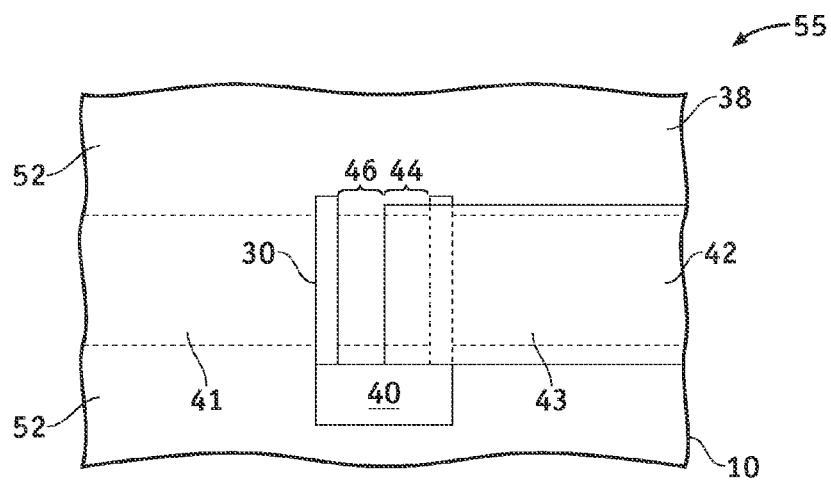
FIGS. 6-7 illustrate, in cross-section, a method for fabricating a multiple finger transistor, in accordance with another exemplary embodiment of the present invention.
Figure 7:
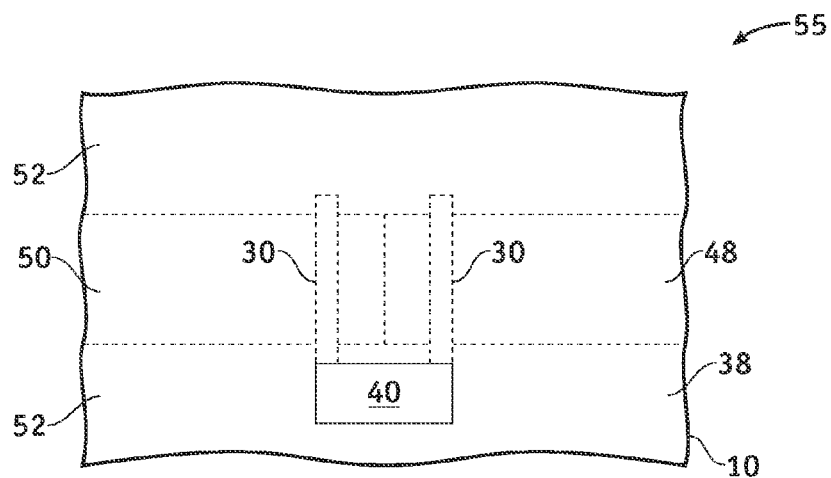

Referring to FIG. 6, in another exemplary embodiment of the invention, an inverter device 55 can be formed after fabrication of gate electrodes 30. The silicon substrate substantially underlying gate electrodes 30 is impurity doped to form P-well 41 and N-well 43. Once gate electrodes 30 are formed and the sidewall spacers are removed, a first masking layer 42 is deposited and patterned to overlie a portion 44 of the semiconductor structure 10 that lies between the gate electrodes 30, and the gate electrode and semiconductor substrate adjacent thereto. The first masking layer 42 can be, for example, a layer of photoresist. Appropriate impurity dopants such as arsenic or phosphorus for an NMOS transistor can be implanted into the exposed P-well 41 of semiconductor substrate 10 using first masking layer 42 as an implant mask to form source and drain regions of an NMOS transistor 50, as illustrated in FIG. 7. The first masking layer is removed and another masking layer (not illustrated) is deposited and patterned to overlie a remaining portion 46 of the semiconductor substrate 10 that lies between the gate electrodes 30, and the gate electrode and semiconductor substrate that are adjacent thereto. Appropriate impurity dopants such as boron for a PMOS transistor are implanted into the exposed N-well 43 of semiconductor substrate 10 to form the source and drain regions of a PMOS transistor 48. It will be appreciated, that while the above-described method provides for the fabrication of an NMOS transistor 50 followed by the fabrication of an adjacent PMOS transistor 48, as illustrated in FIGS. 6-7, the method could also be performed with the fabrication of a PMOS transistor followed by the fabrication of an adjacent NMOS transistor. Dielectric material 38 is deposited overlying the implanted regions and gates 30, a contact opening (not shown) is formed within dielectric material 38, and a conductive gate contact 40 can be formed within the contact opening to make conductive contact to gates 30, as illustrated in FIG. 7.

In accordance with another exemplary embodiment of the invention, a method for fabricating a multiple finger MOSFET transistor 100 having asymmetric active implant regions is illustrated in FIGS. 8-11. The distance between the gates of the multiple finger transistors of the present invention is relatively small, for example, no more than about 50-70 nm for 32 nm node technology. Accordingly, the method takes advantage of this small distance by creating a band energy offset between the source regions and the channel (the area of the semiconductor substrate underlying each of the gates) of the transistor that will cause carriers to travel into the channel from the source regions with a higher injection velocity than if such a band energy offset was not created. A higher injection velocity results in higher current flow through the device.

The method begins with the steps described above with reference to FIGS. 1-3. After the steps illustrated in FIGS. 1-3 are performed, the dummy gate 20 is removed using a suitable dry etch or wet etch, using ARC layer 16 as an etch stop layer. ARC layer 16 is photolithographically patterned and the underlying gate electrode-forming material 12 is etched to form gate electrodes 30, as described above. After formation of the gate electrodes, the sidewall spacers 24 can be removed by suitable etching.

Figure 8:
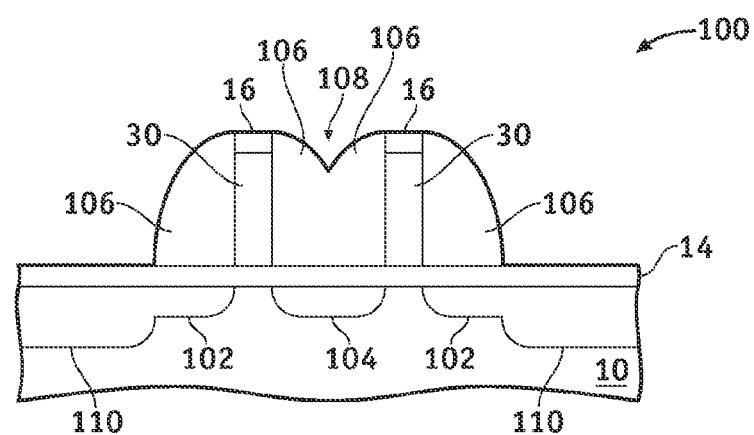
FIGS. 8-11 illustrate, in cross-section, a method for fabricating a multiple finger transistor having asymmetric source and drain regions, in accordance with an exemplary embodiment of the present invention.

Referring to FIG. 8, for an NMOS device, shallow source extensions 102 and a drain region 104 are formed in the semiconductor substrate 10 by implanting arsenic or phosphorous impurity dopant ions at a first implant energy using the gate electrodes 30 as an ion implantation mask. A spacer-forming material is conformally deposited overlying the semiconductor substrate and the gate electrodes 30 and is etched to form sidewall spacers 106 about gate electrodes 30. As illustrated in FIG. 8, the gate electrodes 30 are separated by a space 108. The thickness of the spacer-forming material is selected so that the sidewall spacers 106 are formed having a thickness such that they contact each other within space 108 to mask the semiconductor substrate 10 and gate insulator 14. Deeper source regions 110 then are formed in the semiconductor substrate 10 by implanting arsenic and/or phosphorous impurity dopant ions at a second, higher implant energy using gate electrodes 30 and sidewall spacers 106 as an ion implantation mask. Because the sidewall spacers contact each other within space 108, a deeper source region is not formed in space 108. A PMOS transistor is formed in the same manner with boron implantation instead of arsenic or phosphorous implantation.

Figure 9:
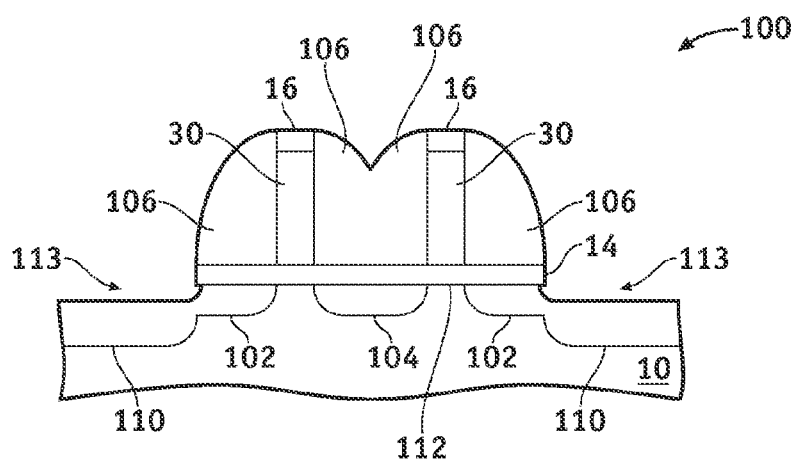

Using the sidewall spacers 106 and gate electrodes 30 as an etch mask, gate insulator 14 and a surface 112 of semiconductor substrate 10 are etched, as illustrated in FIG. 9, to form recesses 113. The more the semiconductor substrate is etched (with subsequent selective epitaxial regrowth, as will be described in more detail below), the greater the area of source contact that will have the band energy offset and the more strain will be created in the device. However, the semiconductor substrate is etched to a thickness that is shallower than the deep source regions 110 and that does not separate the source extensions 102 from the deep source regions 110. In a preferred embodiment of the invention, about 20 to about 50 nm of the semiconductor substrate is etched from surface 112 of the semiconductor substrate. If the semiconductor substrate is silicon, it can be etched by reactive ion etching (RIE) using a $Cl^-$ or $HBr/O_2$ chemistry.

Figure 10:
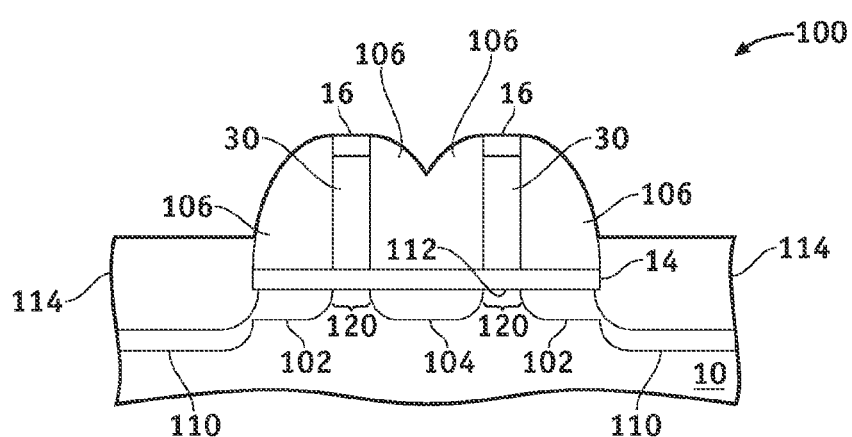

Referring to FIG. 10, the method in accordance with an embodiment of the invention continues with the selective epitaxial growth of a semiconductor material 114 on the semiconductor substrate 10 filling the etched recesses 113. If the semiconductor substrate 10 comprises silicon, the semiconductor material 114 preferably comprises silicon germanium (SiGe) for the fabrication of a PMOS transistor, or silicon carbide (SiC) for the fabrication of an NMOS transistor. The epitaxial silicon layers grow with crystalline orientation that mimics the crystalline orientation of the silicon material upon which they are grown. SiGe has a larger lattice constant than the host silicon and therefore imparts a compressive longitudinal strain on the channel. A compressive longitudinal strain enhances the mobility of majority carrier holes in a PMOS transistor. SiC has a smaller lattice constant than the host silicon and therefore imparts a tensile longitudinal strain on the channel. A tensile longitudinal strain enhances the mobility of majority carrier electrons in the channel of an NMOS transistor. The current carrying capability of an MOS transistor is proportional to the mobility, so an enhanced mobility increases the current carrying capability. In an exemplary embodiment of the present invention, the semiconductor material is grown to a thickness that creates strain in the channels 120 beneath the gate electrodes. In a preferred embodiment of the invention, the semiconductor material is grown to a thickness that is at least about 15 nm above the original surface 112 of semiconductor substrate 10. In a more preferred embodiment of the invention, the semiconductor material is grown to a thickness that is at least about 20 nm above the original surface 112 of semiconductor substrate 10. The grown semiconductor material can be doped N-type or P-type the same as the source extensions 102 and regions 110 using gate electrodes 30 and sidewall spacers 106 as an ion implantation mask or can be impurity doped during growth by adding dopant impurities to the epitaxial reactants.

While the above description refers to the selective epitaxial growth of the same material on both source regions, it will be appreciated that device 100 can be divided into an NMOS device and a PMOS device. In this regard, similar to the methods described above with reference to FIGS. 6-7, a first masking layer is deposited and patterned to lie over one of the recesses 113. Appropriate semiconductor material then may be epitaxially grown (i.e., SiC for an NMOS transistor) and appropriate impurity dopants (i.e., arsenic or phosphorus for an NMOS transistor) can be implanted into the exposed semiconductor material. The first masking layer is removed and a second masking layer is deposited and patterned to lie over the doped epitaxially grown semiconductor material and to expose the remaining recess 113. Appropriate semiconductor material then is epitaxially grown (i.e., SiGe for a PMOS transistor) in the recess and appropriate impurity dopants (i.e., boron for a PMOS transistor) are implanted into the exposed semiconductor material. It will be appreciated, that while the above-described method provides for the fabrication of an NMOS transistor followed by the fabrication of an adjacent PMOS transistor, the method could also be performed with the fabrication of a PMOS transistor followed by the fabrication of an adjacent NMOS transistor.

Figure 11:
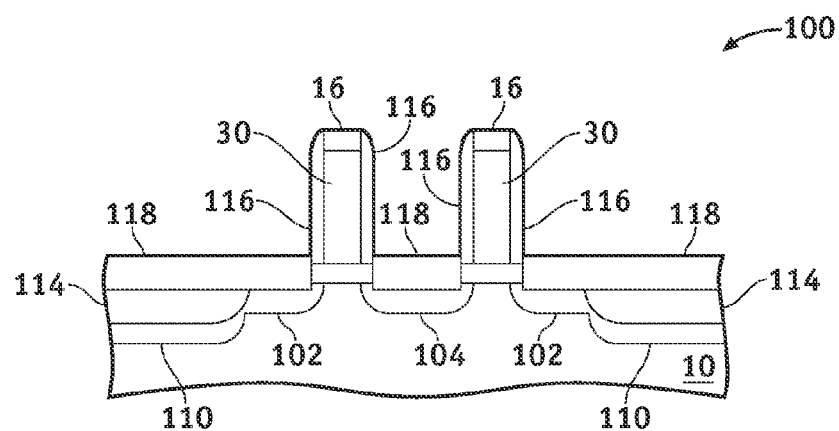

Referring to FIG. 11, the sidewall spacers 106 then are removed. Another sidewall spacer-forming material is deposited overlying gates 30 and the grown semiconductor material and is etched to form relatively thin sidewall spacers 116. Gate insulator 14 is etched using sidewall spacers 116 and gates 30 as an etch mask. In an optional embodiment, an additional impurity dopant implantation can be performed to create a deeper drain region 104. If the grown semiconductor material comprises silicon, metal silicide 118 is formed on the source and drain regions and extensions to make electrical contact thereto. The metal silicide 118 is formed by depositing a silicide-forming metal and heating, such as by rapid thermal annealing (RTA), to cause the silicide-forming metal to react with grown silicon material. The silicide-forming metal can be, for example, cobalt, nickel, rhenium, ruthenium, or palladium. The silicide-forming metal can be deposited, for example, by sputtering. The RTA causes the formation of metal silicide anywhere the silicide-forming metal is in contact with exposed silicon. Any silicide-forming metal that is not in contact with exposed silicon does not react during the RTA to form a silicide and may subsequently be removed by wet etching in an $H_2O_2/H_2SO_4$ or $HNO_3/HCl$ solution.

As described above, the selective epitaxial growth of semiconductor material in the source regions results in an increase in the strain in the channel beneath the gates. Strain in the channels increases the mobility of the carriers through the channel and, thus, increases current through the device. In addition, by selectively epitaxially growing in the source regions a material that is different from the semiconductor substrate, that is, different from the material in the channels, a band energy offset is created, which increases the injection velocity of the carriers, thus further increasing the current through the device. While the above description with reference to FIGS. 8-11 relates to methods for forming an NMOS multiple finger transistor, it will be appreciated that the methods could also be used for forming a PMOS multiple finger transistor.

In accordance with another exemplary embodiment of the invention, a method for fabricating a multiple finger MOSFET transistor 150 having asymmetric source and drain silicide regions is illustrated in FIGS. 12-17. In conventional MOS devices, conductive silicide regions create a significant Schottky barrier ($\geq 0.5$ V) that introduces high resistance at the source/channel and drain/channel interfaces. This high resistance limits drive current through the channel of the device. In contrast, if a multiple finger transistor is created using a method that creates a Schottky barrier at the source/channel interface that is different from that at the drain/channel interface, the resistance at the channel interfaces can be reduced, thus improving current flow through the device.

Figure 12:
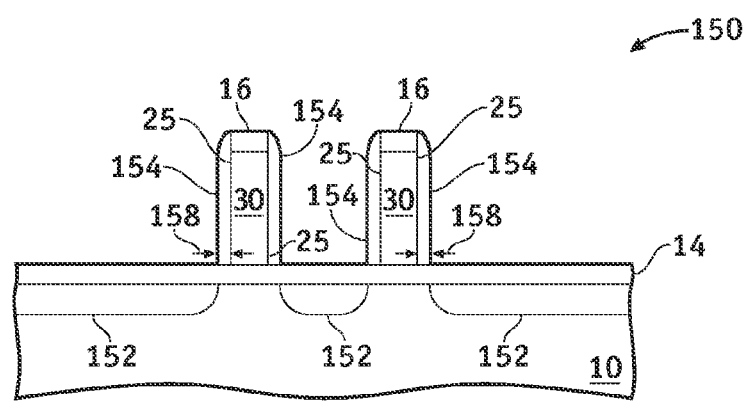
FIGS. 12-17 illustrate, in cross-section, a method for fabricating a multiple finger transistor having asymmetric metal silicide regions, in accordance with an exemplary embodiment of the present invention.

The method begins with the steps described above with reference to FIGS. 1-3. After the steps illustrated in FIGS. 1-3, a first sidewall spacer-forming material layer (not shown) is conformally deposited overlying gates 30 and semiconductor substrate 10 and is suitably etched to form first sidewall spacers 154 about sidewalls 25 of gate electrodes 30, as illustrated in FIG. 12. The first sidewall spacer-forming material can be, for example, silicon nitride, silicon oxide, or silicon oxynitride. In a preferred embodiment of the invention, the first sidewall spacers 154 are formed of silicon nitride and have a thickness, illustrated by double-headed arrows 158, in the range of about 1-10 nm, more preferably in the range of about 3-5 nm. Source and drain extensions 152 are formed in the semiconductor substrate 10 by implanting appropriate impurity dopants, such as arsenic or phosphorus for an NMOS transistor and boron for a PMOS transistor, using a first implant energy, as illustrated in FIG. 12. The semiconductor substrate is then annealed, as is well known in the semiconductor industry. It will be appreciated that if the multiple finger transistor device 150 is an NMOS transistor, the drain extension will be disposed between the gate electrodes 30 and the source extensions will be disposed outside of the gate electrodes. Alternatively, if device 150 is a PMOS transistor, a source extension will be disposed between the gate electrodes 30 with drain extensions outside the gate electrodes.

Figure 13:
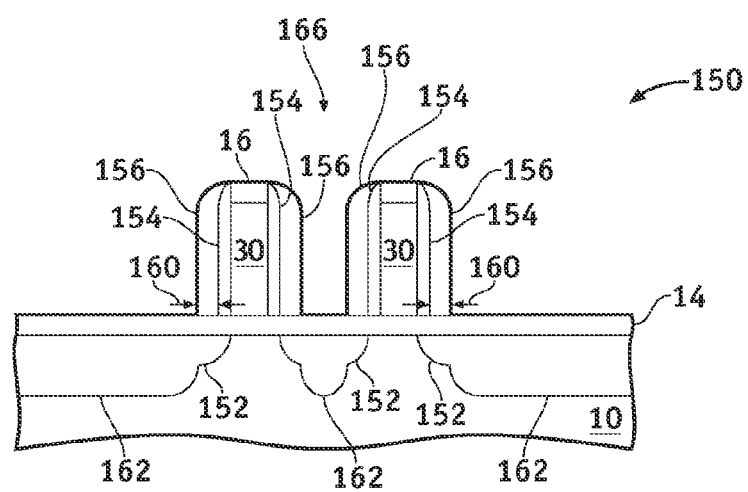

Referring to FIG. 13, a second sidewall spacer-forming material layer (not shown) is conformally deposited overlying gates 30, first sidewall spacers 154, and semiconductor substrate 10 and is suitably etched to form second sidewall spacers 156. In a preferred embodiment, if the first sidewall spacers 154 are formed of silicon nitride, then second sidewall spacers 156 are formed of silicon oxide or silicon oxynitride and have a thickness, illustrated by double-headed arrows 160, in the range of about 10-15 nm, more preferably in the range of about 10-12 nm. The second sidewall spacers disposed between the gate electrodes 30 are separated by a space 166. Deeper source and drain regions 162 then are formed in the semiconductor substrate 10 by introducing the same or different impurity dopants at a second, higher implant energy using gate electrodes 30, first sidewall spacers 154, and second sidewall spacers 156 as an ion implantation mask.

Figure 14:
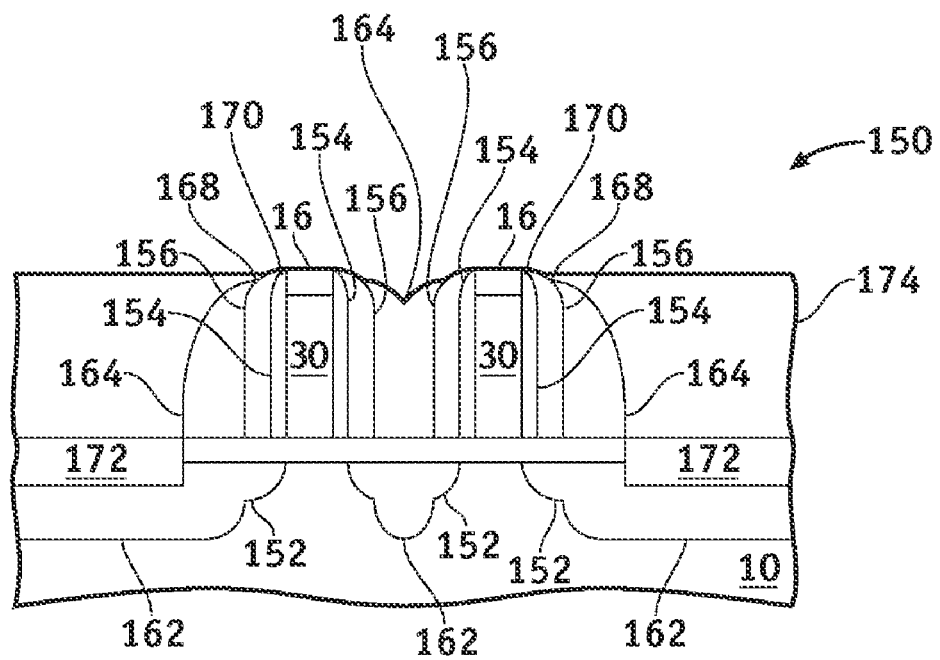

The method in accordance with this exemplary embodiment of the present invention continues with the conformal deposition of a third sidewall spacer-forming material layer (not shown) overlying gates 30, first sidewall spacers 154, second sidewall spacers 156, and semiconductor substrate 10. The third sidewall spacer-forming material layer is suitably etched to form third sidewall spacers 164, as illustrated in FIG. 14. In a preferred embodiment of the present invention, the third sidewall spacers 164 are formed of silicon nitride and are sufficiently thick so that the third sidewall spacers disposed between the gate electrodes 30 contact each other within space 166. In another preferred embodiment of the invention, third sidewall spacers 164 are formed so that a top point 168 of third sidewall spacers 164 is disposed at least 20 nm below a top point 170 of second sidewall spacers 156.

After formation of third sidewall spacers 164, gate insulator 14 is etched, such as by, for example, exposure to diluted HF acid, and metal contacts 172 are formed on the exposed semiconductor substrate 10. If the semiconductor substrate is silicon, metal contacts 172 are formed from a metal silicide, as described above, on the exposed active regions and extensions to make electrical contact thereto. If device 150 is an NMOS transistor, the device can be created with a low Schottky barrier on the source side of the source/channel interface and a high Schottky barrier on the drain side of the drain/channel interface (where the drain lies between gate electrodes 30). In this regard, in the case of an NMOS transistor, a suitable metal silicide material is deposited on the exposed source extensions and regions 152 and 162. Suitable metal silicide materials to create the low Schottky barrier on the source side of the source/channel interface include, but are not limited to, erbium silicide ($ErSi_2$) and ytterbium silicide ($YbSi_x$, where x is any number greater than zero). In contrast, if device 150 is a PMOS transistor, the device can be created with a high Schottky barrier on the source side of the source/channel interface (where the source lies between the gate electrodes 30) and a low Schottky barrier on the drain side of the drain/channel interface. An insulating oxide layer 174 is deposited overlying the metal silicide 172 and the sidewalls and gate electrodes and a portion is removed to expose third sidewall spacers 164 disposed between the gate electrodes 30. The portion of insulating oxide layer 174 can be removed by, for example, chemical mechanical planarization.

Figure 15:
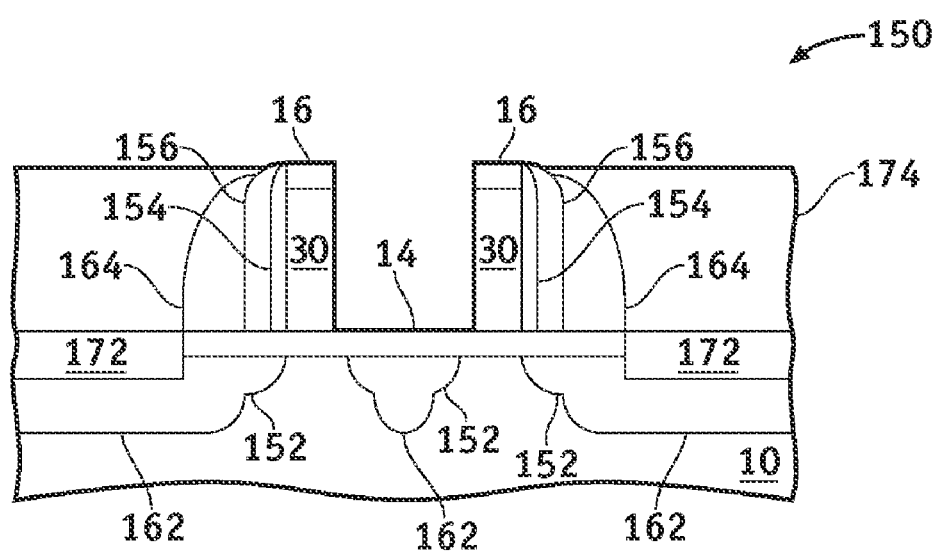
Figure 16:
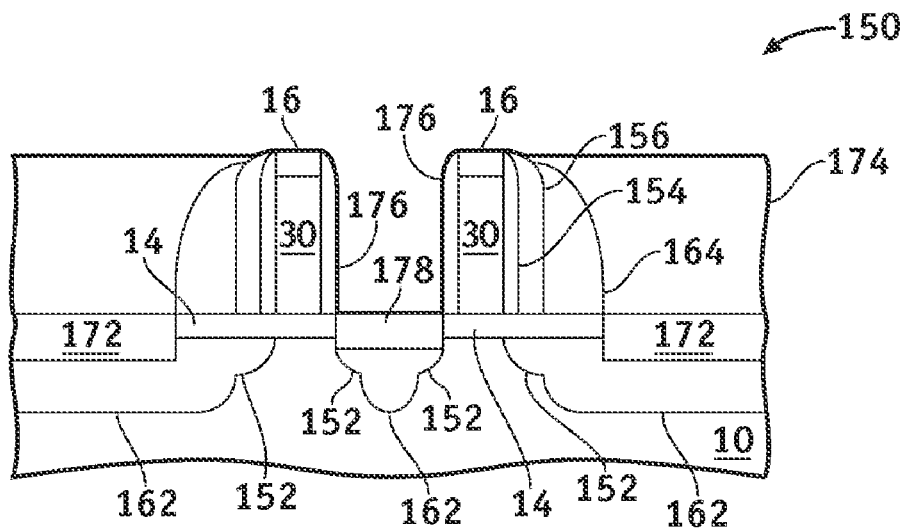

Referring to FIG. 15, first, second, and third sidewall spacers 154, 156, and 164 between gate electrodes 30 are suitably etched to remove them from between gate electrodes 30. The sidewall spacers can be removed by, for example, diluted HF acid and/or hot phosphoric acid. As illustrated in FIG. 16, a relatively thin fourth sidewall spacer-forming material layer is conformally deposited and is etched to form fourth sidewall spacers 176 that serve to protect gate electrodes 30. Fourth sidewall spacers 176 may be formed of any suitable material, including silicon nitride, silicon oxide, and silicon oxynitride. Preferably, fourth sidewall spacers 176 are formed of silicon nitride. Gate insulator 14 then is etched from between the fourth sidewall spacers 176.

Figure 17:
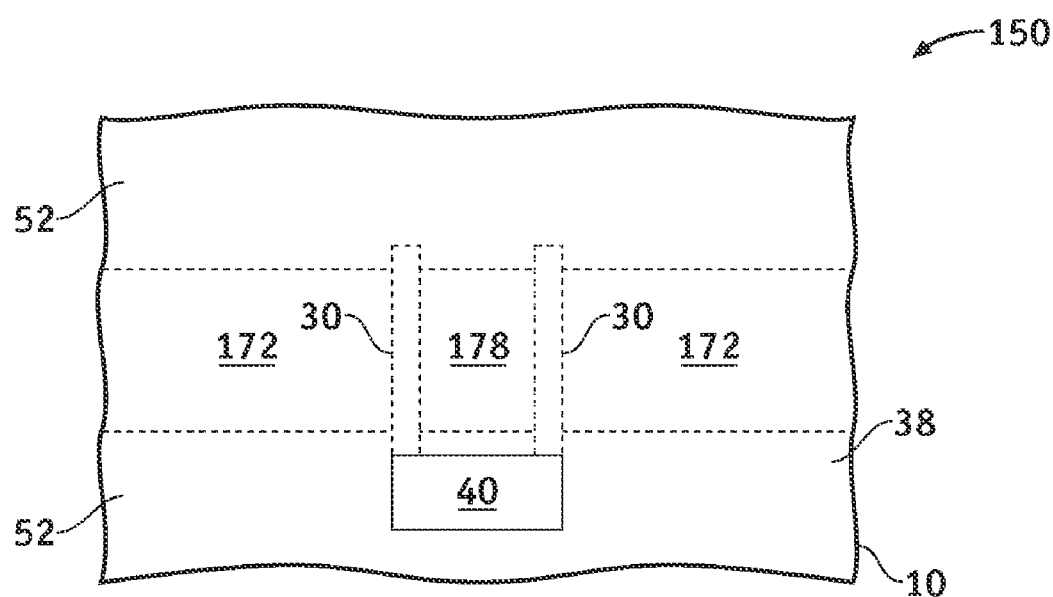

A metal contact 178 is formed on the exposed semiconductor substrate 10 between gate electrodes 30. If the semiconductor substrate is silicon, metal silicide 178 is formed, as described above, on the exposed active region and extension to make electrical contact thereto. As described above, if device 150 is an NMOS transistor, the device can be created with a high Schottky barrier on the drain side of the drain/channel interface. In this regard, in the case of an NMOS transistor, a suitable metal silicide material is deposited on the exposed drain extension and region 152 and 162. Suitable metal silicide materials include, but are not limited to, platinum silicide (PtSi) and iridium silicide (IrSi). The photoresist, dielectric layer 174, and sidewall spacers then can be removed. A dielectric material 38 may be deposited overlying the silicide regions and gate electrodes 30, a contact opening (not shown) can be formed within dielectric material 38, and a conductive gate contact 40 can be formed within the contact opening to make conductive contact to gate electrodes 30, thus providing a structure as illustrated in FIG. 17. Conductive contacts (not shown) also are made through dielectric material 38 to metal silicides 172.

Accordingly, methods for fabricating multiple finger transistors have been provided. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a multiple finger transistor, the method comprising the steps of:
    forming at least two gate electrodes overlying a surface of a semiconductor substrate, wherein the at least two gate electrodes are separated by a space;
    implanting first impurity dopants into the semiconductor substrate using a first implant energy, wherein the at least two gate electrodes serve as an implantation mask;
    forming first sidewall spacers about the at least two gate electrodes and within the space, wherein the first sidewall spacers within the space contact each other;
    implanting second impurity dopants into the semiconductor substrate using a second implant energy, wherein the first sidewall spacers and the at least two gate electrodes serve as an implantation mask;
    removing a portion of the semiconductor substrate from the surface of the semiconductor substrate to form a recess;
    selectively epitaxially growing semiconductor material in the recess on the semiconductor substrate;
    removing the first sidewall spacers; and
    forming regions comprising metal on the semiconductor material.

2. A method for fabricating a multiple finger transistor, the method comprising the steps of:
    forming at least two gate electrodes overlying a semiconductor substrate;
    forming first sidewall spacers about the at least two gate electrodes;
    implanting first impurity dopants into the semiconductor substrate using a first implant energy, wherein the at least two gate electrodes and first sidewall spacers serve as an implantation mask;
    forming second sidewall spacers about the first sidewall spacers;
    implanting second impurity dopants into the semiconductor substrate using a second implant energy, wherein the at least two gate electrodes, the first sidewall spacers, and the second sidewall spacers serve as an implantation mask;
    forming third sidewall spacers about the second sidewall spacers, wherein the third sidewall spacers between the at least two gate electrodes contact each other;
    forming first regions comprising metal on the semiconductor substrate;
    etching the first, second and third sidewall spacers between the at least two gate electrodes to expose a portion of the semiconductor substrate between the at least two gate electrodes; and
    forming a second region comprising metal on the exposed semiconductor substrate.

3. The method of claim 1, further comprising the step of forming second sidewall spacers about the at least two gate electrodes before the step of forming regions comprising metal.

4. The method of claim 1, wherein the step of forming at least two gate electrodes overlying a surface of a semiconductor substrate comprises the steps of:
    forming a layer of gate-forming material overlying a semiconductor substrate;
    forming a layer of dummy gate material overlying the layer of gate-forming material;
    etching the layer of dummy gate material to form a dummy gate;

forming sidewall spacers about sidewalls of the dummy gate;

removing the dummy gate; and etching the layer of gate-forming material using the sidewall spacers as a mask to form the at least two gate electrodes.

5. The method of claim 1, wherein the step of implanting second impurity dopants comprises the step of implanting first impurity dopants.

6. The method of claim 1, wherein the step of forming at least two gate electrodes overlying a surface of a semiconductor substrate comprises the step of forming at least two gate electrodes overlying a surface of a silicon substrate and wherein the step of forming regions comprising metal on the semiconductor substrate comprises the step of forming silicon germanium regions or silicon carbide regions on the silicon substrate.

7. The method of claim 1, wherein the step of removing a portion of the semiconductor substrate from the surface of the semiconductor substrate comprises the step of removing about 20 nm to about 50 nm of the semiconductor substrate from the surface of the semiconductor substrate.

8. The method of claim 2, wherein the step of forming at least two gate electrodes overlying a semiconductor substrate comprises the steps of:

forming a layer of gate-forming material overlying a semiconductor substrate;

forming a layer of dummy gate material overlying the layer of gate-forming material;

etching the layer of dummy gate material to form a dummy gate;

forming fourth sidewall spacers about sidewalls of the dummy gate;

removing the dummy gate; and etching the layer of gate-forming material using the fourth sidewall spacers as a mask to form the at least two gate electrodes.

9. The method of claim 2, further comprising the steps of:

globally depositing a dielectric layer after the step of forming first regions; and removing a portion of the dielectric layer overlying the first, second and third sidewall spacers that are disposed between the at least two gate electrodes.

10. The method of claim 2, wherein the step of forming first regions comprising metal comprises forming first metal silicide regions and the step of forming a second region comprising metal comprises forming a second metal silicide region.

11. The method of claim 2, wherein the step of forming third sidewall spacers comprises the step of forming third sidewall spacers so that a top point of the third sidewall spacers is disposed at least 20 nm below a top point of the second sidewall spacers.

12. The method of claim 10, wherein the step of forming first metal silicide regions comprises the step of forming metal silicide regions of erbium silicide or ytterbium silicide.

13. The method of claim 10, wherein the step of forming a second metal silicide region comprises the step of forming a metal silicide region of platinum silicide or iridium silicide.

* * * * *